United States Patent
Kim et al.

(10) Patent No.: US 7,545,000 B2
(45) Date of Patent: Jun. 9, 2009

(54) SCHOTTKY BARRIER TUNNEL TRANSISTOR AND METHOD OF MANUFACTURING THE SAME

(75) Inventors: Yark Yeon Kim, Daejeon (KR); Seong Jae Lee, Daejeon (KR); Moon Gyu Jang, Daejeon (KR); Chel Jong Choi, Daejeon (KR); Myung Sim Jun, Daejeon (KR); Byoung Chul Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 61 days.

(21) Appl. No.: 11/485,837

(22) Filed: Jul. 13, 2006

(65) Prior Publication Data
US 2007/0034951 A1 Feb. 15, 2007

(30) Foreign Application Priority Data
Dec. 8, 2005 (KR) .................... 10-2005-0119409

(51) Int. Cl.
*H01L 27/01* (2006.01)
(52) U.S. Cl. .................................... 257/347; 257/411
(58) Field of Classification Search ................ 257/347, 257/411, 412, 471
See application file for complete search history.

(56) References Cited
U.S. PATENT DOCUMENTS
6,339,005 B1   1/2002  Bryant et al.

7,385,264 B2 *  6/2008  Muraoka ................ 257/410
2006/0118899 A1 *  6/2006  Jang et al. ................ 257/471

FOREIGN PATENT DOCUMENTS

| JP | 2002-237602 | 8/2002 |
|---|---|---|
| KR | 2000-0025576 | 5/2000 |
| KR | 2001-0065192 | 7/2001 |
| KR | 2003-0047556 | 6/2003 |
| KR | 10-2005-0065899 | 6/2005 |

OTHER PUBLICATIONS

'Suppression of leakage current in Schottky barrier metal-oxide-semiconductor field-effect transistors' Calvet et al., Journal of Applied Physics, vol. 91, No. 2, Jan. 15, 2002, pp. 757-759.

* cited by examiner

*Primary Examiner*—Mark Prenty
(74) *Attorney, Agent, or Firm*—Ladas & Parry LLP

(57) ABSTRACT

Provided are a Schottky barrier tunnel transistor and a method of manufacturing the same that are capable of minimizing leakage current caused by damage to a gate sidewall of the Schottky barrier tunnel transistor using a Schottky tunnel barrier naturally formed at a semiconductor-metal junction as a tunnel barrier. The method includes the steps of: forming a semiconductor channel layer on an insulating substrate; forming a dummy gate on the semiconductor channel layer; forming a source and a drain at both sides of the dummy gate on the insulating substrate; removing the dummy gate; forming an insulating layer on a sidewall from which the dummy gate is removed; and forming an actual gate in a space from which the dummy gate is removed. In manufacturing the Schottky barrier tunnel transistor using the dummy gate, it is possible to form a high-k dielectric gate insulating layer and a metal gate, and stable characteristics in silicidation of the metal layer having very strong reactivity can be obtained.

3 Claims, 4 Drawing Sheets

SCHOTTKY BARRIER TUNNEL TRANSISTOR AND METHOD OF MANUFACTURING THE SAME

CROSS-REFERENCE TO RELATED APPLICATION

This application claims priority to and the benefit of Korean Patent Application No. 2005-119409, filed Dec. 8, 2005, the disclosure of which is incorporated herein by reference in its entirety.

BACKGROUND

1. Field of the Invention

The present invention relates to a Schottky barrier tunnel transistor using a Schottky tunnel barrier naturally formed at a semiconductor-metal junction as a tunnel barrier, and a method of manufacturing the same. More particularly, the present invention relates to a method of manufacturing a Schottky barrier tunnel transistor capable of minimizing leakage current caused by damage to a gate sidewall, which is useful in manufacturing a Schottky barrier tunnel transistor using samarium silicide.

2. Discussion of Related Art

Recent semiconductor device manufacturing technology enables the manufacture of a transistor having a short channel of 50 nm or less. However, reduction of the size of a device is accompanied by new phenomena which adversely affect the operation characteristics of the device. Specifically, in a transistor having a short channel of 100 nm or less, leakage current caused by a short channel effect is very large and thus important to suitably control. A variety of research for overcoming such drawbacks is underway. One new alternative being examined is the reduction of a Schottky MOSFET in which a source and drain are replaced by metal or silicide to have a channel length of 35 nm or less. As junction depth is reduced, a parasitic resistance component of the source and drain including a source-drain extension (SDE) caused by conventional ion diffusion is increased so that, assuming a doping concentration of $1E19/cm^3$ and a depth of 10 nm, a surface resistance value exceeds 500 ohm/sq.

FIG. 1 is a cross-sectional view of a conventional widely used Schottky barrier tunnel transistor. In the conventional technology for manufacturing the Schottky barrier tunnel transistor, a gate electrode 21 was first formed and a silicidation process of a source and a drain was finally performed. However, in an N-type Schottky barrier tunnel transistor, metal having very strong reactivity is deposited on the source and drain and then the resultant is annealed. Accordingly, gate leakage current is generated through an insulating layer 28 formed on a gate sidewall. In other words, in the conventional method of manufacturing the Schottky barrier tunnel transistor, there is a drawback in that, in the N-type transistor, the metal deposited on the source and drain damages the insulating layer 28 formed on the gate sidewall due to its very large reactivity, thereby causing the gate leakage current.

In order to prevent the above-described drawback side effect, in the conventional transistor manufacturing method, after the silicidation process is performed, a metal layer generated from the gate sidewall insulating layer 28 should be removed. The removal of the metal layer actually has many difficulties. As a result, it is difficult to suppress generation of the gate leakage current caused by the damage to the gate sidewall insulating layer 28.

SUMMARY OF THE INVENTION

The present invention is directed to a Schottky barrier tunnel transistor capable of minimizing gate leakage current.

The present invention is also directed to a method of manufacturing a Schottky barrier tunnel transistor capable of recovering damage to a gate sidewall insulating layer caused by a silicidation process.

One aspect of the present invention provides a Schottky barrier tunnel transistor including: a silicon on insulator (SOI) substrate; a channel layer formed on the SOI substrate; a source and a drain formed at both sides of the channel layer on the SOI substrate; a gate formed on the channel layer; a first gate insulating layer for insulating the gate from the source, the drain, and the channel layer; and a second gate insulating layer formed between the first gate insulating layer and the gate.

Another aspect of the present invention provides a method of manufacturing a Schottky barrier tunnel transistor, the method including the steps of: forming a semiconductor channel layer on an insulating substrate; forming a dummy gate on the semiconductor channel layer; forming a source and a drain at both sides of the dummy gate on the insulating substrate; removing the dummy gate; forming an insulating layer on a sidewall from which the dummy gate is removed; and forming an actual gate in a space from which the dummy gate is removed.

In the conventional art, a gate sidewall is damaged when a formed gate is subjected to a silicidation process including highly reactive metal deposition and annealing. In the present invention, a dummy gate temporarily provided for a manufacturing process can be used to stabilize a gate sidewall insulating layer of an N-type Schottky barrier tunnel transistor, thereby reducing gate leakage current. In addition, as a result of depletion between a high dielectric gate oxide layer and a gate electrode and an oxide layer, an effective oxide layer increases in thickness. Consequently, polysilicon facilitates formation of a metal gate during the manufacturing process. Further, gate overlap is improved, thereby making it possible to increase saturation current.

In other words, in the manufacture of the Schottky barrier tunnel transistor, after a gate electrode is formed, metal is finally deposited to form a source and a drain and then the deposited source and drain are silicided through an annealing process. As annealing temperature increases, rare earth metal having very strong reactivity reacts with a gate sidewall insulating layer and increases gate leakage current which degenerate device characteristics. In order to prevent this, the present invention provides a method for first growing silicide at the source and drain using the dummy gate, and then forming an actual gate, its subsequent gate insulating layer, and a metal gate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, an exemplary embodiment of the present invention will be described in detail. However, the present invention is not limited to the exemplary embodiments disclosed below, but can be implemented in various types. Therefore, the present embodiment is provided for complete disclosure of the present invention and to fully inform the scope of the present invention to those ordinarily skilled in the art.

Figure 1:
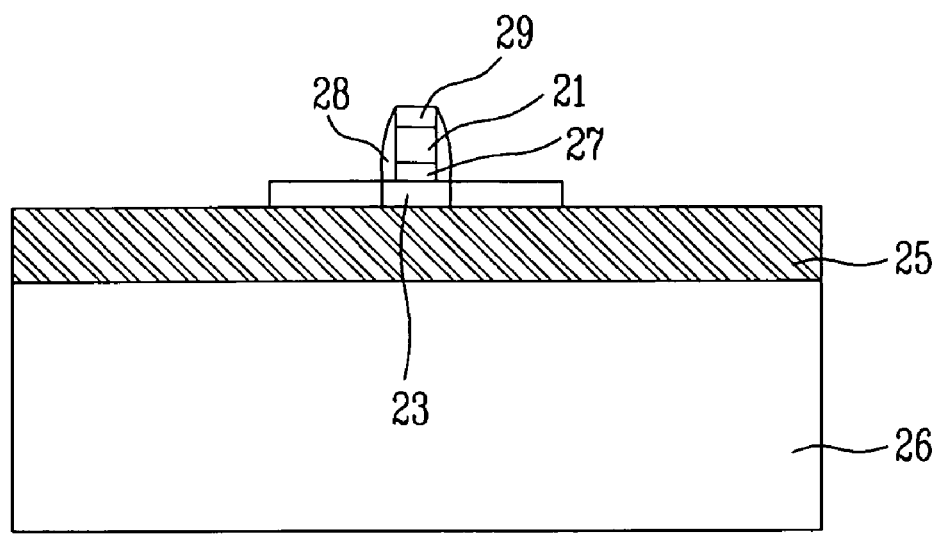
FIG. 1 is a cross-sectional view of a conventional widely used Schottky barrier tunnel transistor formed on a silicon on insulator (SOI) substrate.
Figure 2:
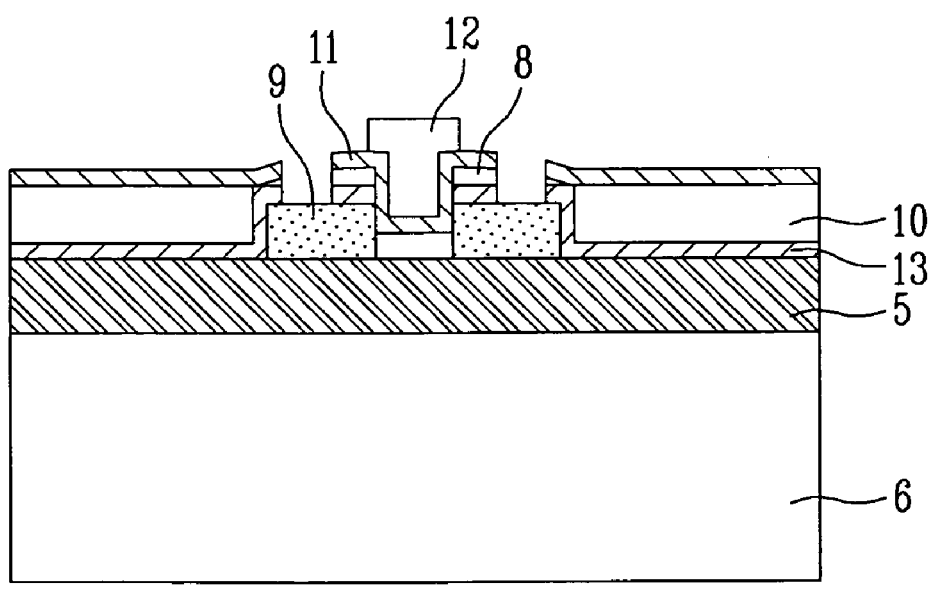
FIG. 2 is a cross-sectional view of a Schottky barrier tunnel transistor formed on an SOI substrate according to an exemplary embodiment of the present invention.

FIG. 2 is a cross-sectional view of a Schottky barrier tunnel transistor manufactured using a high-k dielectric gate insulating layer 8 and a metal gate electrode 12 according to the present invention. In order to effectively reduce resistance of the transistor, a source and a drain 9 of the Schottky barrier tunnel transistor are formed of suicide that is a compound of silicon and metal, and at a channel region, a gate electrode is formed of a high-k dielectric insulating layer and a metal layer. For insulation between the source and the gate and between the drain and the gate, a first insulating layer 8 and a second insulating layer 11 are formed on sidewalls of a gate 12. The first insulating layer 8 is formed before a dummy gate is formed, and the second insulating layer 11 is formed after the dummy gate is removed. Alternatively, the first insulating layer 8 can be completely removed before the second insulating layer 11 is formed, and the second insulating layer 11 can be formed by separately depositing a high-k dielectric material having no relation with a substrate material. The gate 12 can be formed of metal, thereby more improving the characteristics of the transistor. This is possible because, since the metal gate 12 is formed after the silicidation process, damage to the gate insulating layer 11 caused by constituent molecules of the metal gate is not cared when the silicidation process is performed.

FIGS. 3 to 11 are cross-sectional views illustrating a detailed process for forming the Schottky barrier tunnel transistor of FIG. 2.

Figure 3:
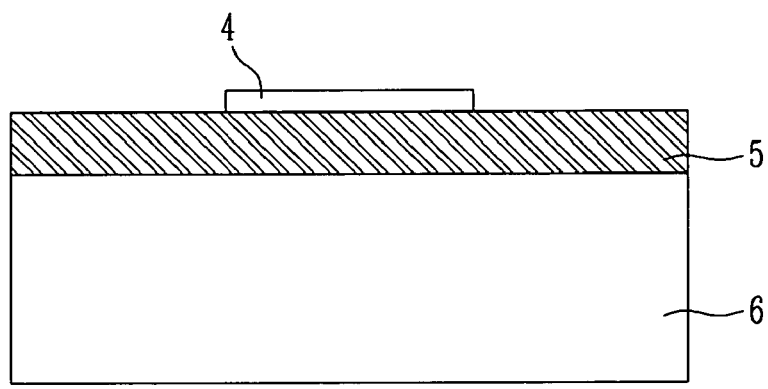
FIGS. 3 to 11 are cross-sectional views illustrating a detailed process for forming the Schottky barrier tunnel transistor of FIG. 2.

In the cross-sectional view of FIG. 3, after a silicon on insulator (SOI) channel layer 4 having a small thickness is formed, a region for forming the Schottky barrier tunnel transistor is left by dry etching.

The Schottky barrier tunnel transistor according to the present invention should be manufactured on the basis of an insulating substrate. In consideration of mounting in a silicon chip and reduction of the manufacturing cost, as shown, an insulating layer 5 may be formed on the silicon substrate 6. The insulating layer 5 may be silicon oxide ($SiO_2$) which is easily formed on the silicon substrate. If the SOI channel layer 4 has a small thickness (for example, 100 nm or less), a channel region controlled by a gate has a small thickness and an inversion layer is very easily formed. As a result, this reduces the leakage current between the source and drain of the completed transistor.

Figure 4:
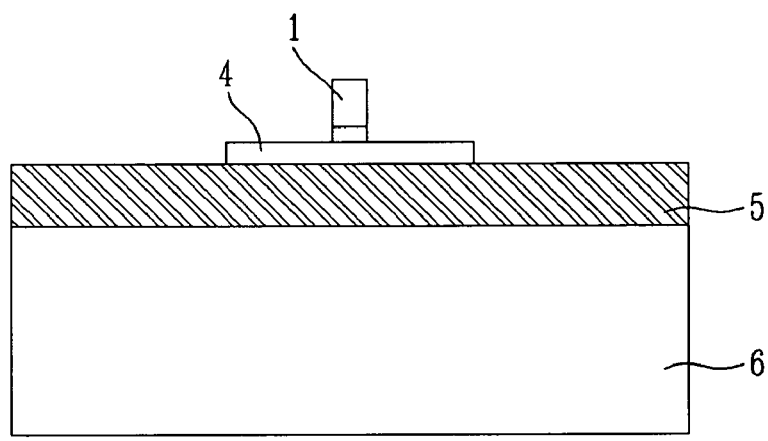

FIG. 4 is a cross-sectional view after a dummy gate 1 formed of a gate silicon oxide layer and polysilicon is patterned using photoresist and then dry etched in order to perform the silicidation process on the source and drain before the formation of the metal gate. In other words, the dummy gate 1 of FIG. 3 is formed by forming an oxide layer on the SOI channel layer 4, and forming the dummy gate 1 on the oxide layer using the polysilicon (or silicon nitride layer).

According to the embodiment, the dummy gate can also be formed without the silicon oxide layer but, in order to more uniformly secure characteristics of the insulating layer of the actual gate to be formed later, in the step, the silicon oxide layer may be formed on the SOI channel layer 4.

Figure 5:
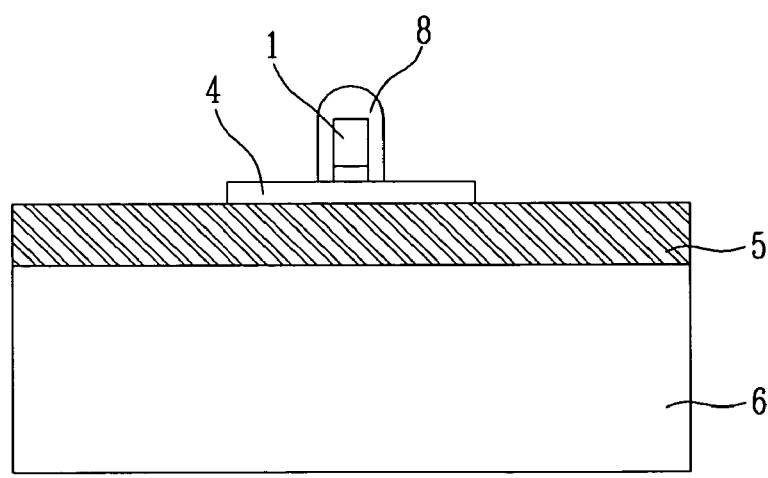

In FIG. 5, a polysilicon dummy gate 1 is formed, and a silicon oxide layer 8 is formed and dry etched on the exposed surface of the dummy gate 4 in order to form a sidewall insulating layer between the drain and gate, thereby providing the whole structure. The sidewall insulating layer 8 can be formed of a nitride silicon layer or a silicon oxide layer that is formed by annealing in an oxygen atmosphere.

Figure 6:
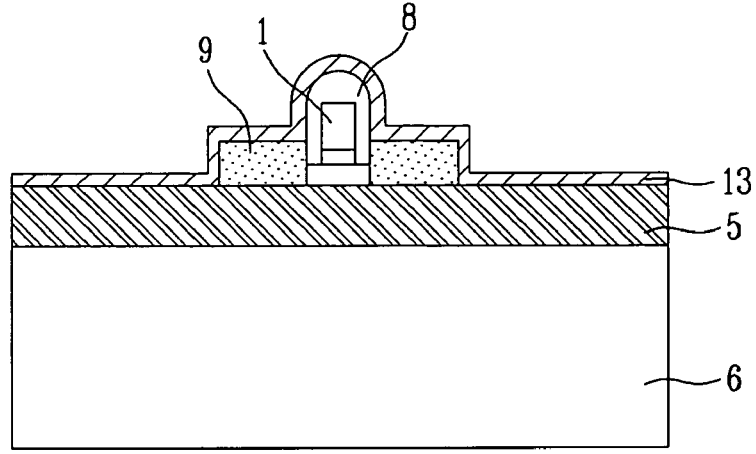

As shown in FIG. 6, the SOI channel layer 4 of regions in which the source and drain are formed is then etched, and the source and drain 9 are formed by a photography process. The source and drain 9 are formed of a silicon material, preferably polysilicon. FIG. 6 illustrates the state after depositing rare earth metal having strong reactivity to the source and drain 9, performing the silicidation process of the source and drain 9, removing unreacted metal, and depositing a silicon nitride (SiN) layer 13 to prevent reaction between Hydrogen Silsesquioxane (HSQ) and silicide in a subsequent process. The silicide is formed by depositing a metal layer of samarium (Sm), erbium (Er), ytterbium (Yb), neodymium (Nd), dysprosium (Dy), palladium (Pd), and iridium (Ir), and reacting the deposited metal layer using a rapid annealing apparatus. Metal layers other than the source, drain, and gate electrodes are removed using a mixture solution of sulfuric acid and hydrogen peroxide (1:1). In manufacturing an N-type transistor, at least one of the group consisting of samarium (Sm), erbium (Er), neodymium (Nd), ytterbium (Yb), and dysprosium (Dy) can be selected. In manufacturing a P-type transistor, at least one of the group consisting of platinum (Pt), palladium (Pd), and iridium (Ir) can be selected. In other words, the source and drain 9 of FIG. 6 are formed by forming a silicon source layer and a silicon drain layer in regions in which the source and drain are formed, adding the rare earth metal to the silicon source layer and the silicon drain layer, and annealing the resultant structure.

When the source and drain 9 are silicided by the above-described process, the dummy gate 1 should be removed. As a method for removing the dummy gate 1, there are a method using a general photolithography process, and a method of selectively etching using a height difference of the structure. A photolithography process of a general semiconductor process can be used in the former, but the latter is cheaper and simpler. A description of the former which can be analogized from the conventional art will be omitted, and the latter will be described below. In this case, the dummy gate removing step may include the steps of forming a reaction blocking layer 13 on the resultant of FIG. 5, coating the HSQ 10 on the resultant covering the reaction blocking layer 13, etching the resultant covered with the HSQ 10, and removing the dummy gate 1. The steps will be described with reference to the drawings below.

Figure 7:
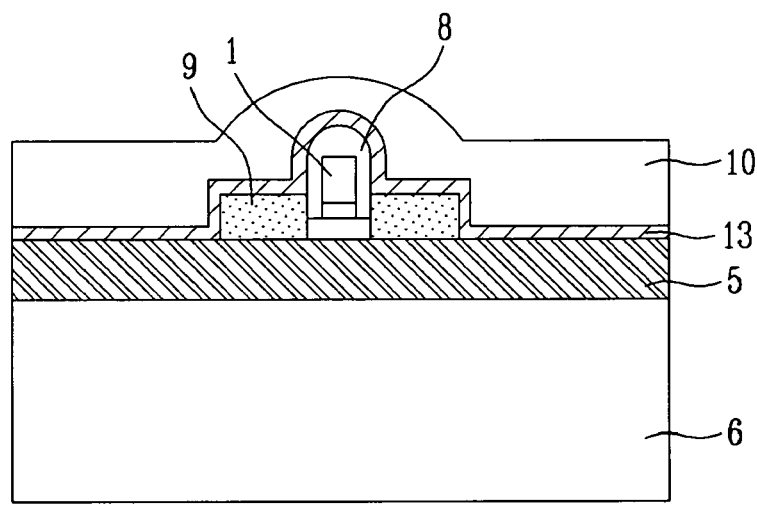

FIG. 7 illustrates a structure obtained by coating the HSQ 10 on the resultant of FIG. 6 subjected to the silicidation process in a spin coater, and annealing the resultant structure. By centrifugal force resulting from rotation of the spin coater, and surface tension of the HSQ 10, the HSQ 10 is coated to have a uniform height on the resultant, but coated to have very small thickness on the dummy gate 1 having a protrusion greater than other portions.

Figure 8:
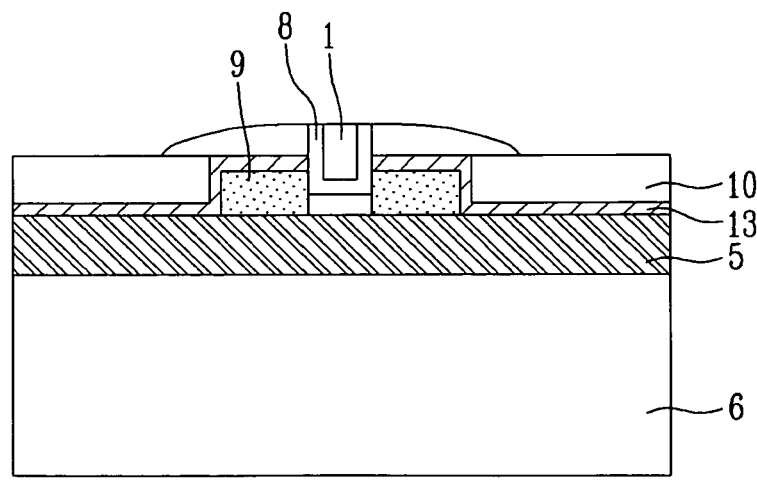

FIG. 8 illustrates the state in which the coated HSQ 10 is etched up to the dummy gate 1 by dry or wet etching. In this state, the silicide of the source and drain is still sufficiently covered with the HSQ 10 so that it is not exposed to the exterior.

Figure 9:
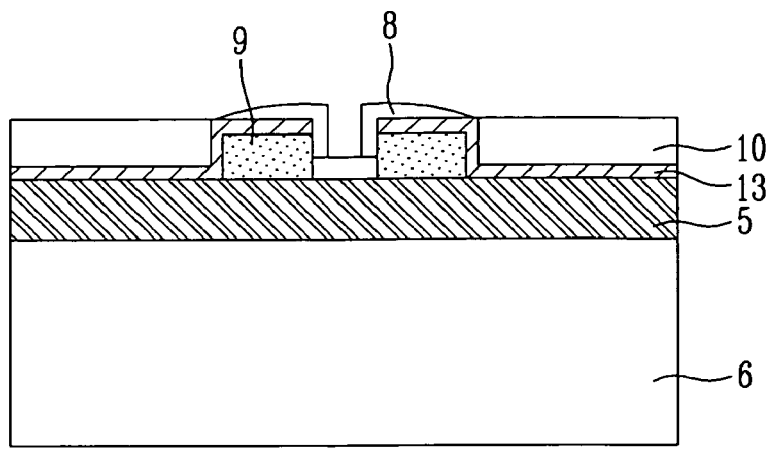

FIG. 9 illustrates after the exposed dummy gate 1 is removed using silicon etchant or phosphorous acid and the silicon channel region is exposed out. The HSQ 10 acts to protect the silicide of the source and drain 9 when the dummy gate 1 is etched. The HSQ 10 is etched by a predetermined etchant, but not easily etched by the silicon etchant or the phosphorous acid so that it serves as an etching stopper against the silicon etchant or the phosphorous acid.

Figure 10:
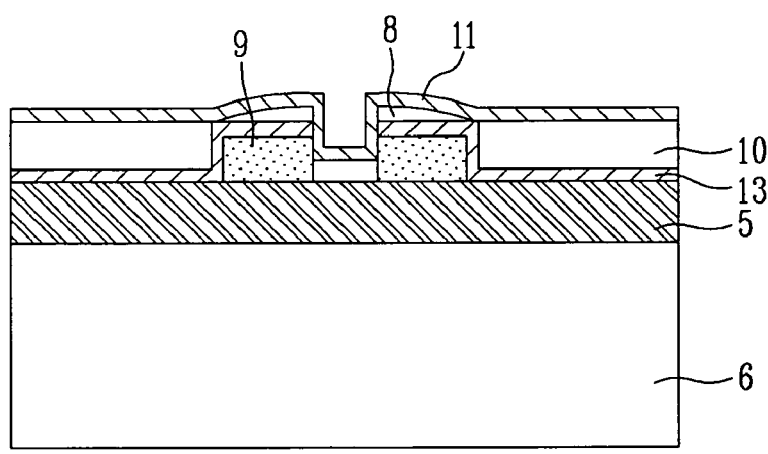

FIG. 10 illustrates the state in which a high-k dielectric insulating layer 11 is formed on the silicon channel region. The high-k dielectric insulating layer 11 may be formed of an insulating compound that is generated from silicon, but formed of a high-k dielectric material which is separately deposited without reaction with silicon of the silicon substrate in order to secure high permittivity and obtain more improved characteristics.

Figure 11:
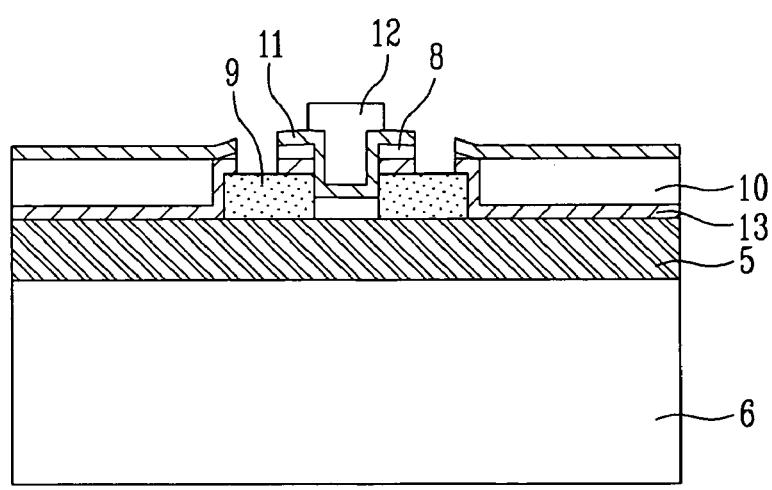

FIG. 11 illustrates the state in which, after the metal is deposited on the high-k dielectric insulating layer 11 to form a gate 12, the gate, source, and drain electrodes are formed. In the above-described process, the unit Schottky barrier tunnel transistor according to spirit of the present invention is completed. After that, interconnections necessary for the source, gate, and drain electrodes are connected.

By performing a series of processes from FIGS. 3 to 11, the reliable Schottky barrier tunnel transistor according to the present invention can be manufactured.

In a Schottky barrier tunnel transistor according to the proposed structure, it is possible to recover the damage to a gate sidewall insulating layer of the Schottky barrier tunnel transistor caused by a silicidation process.

Accordingly, the Schottky barrier tunnel transistor manufactured according to the present invention has an effect of minimizing the gate leakage current.

Further, in manufacturing the Schottky barrier tunnel transistor using a dummy gate according to the present invention, a high-k dielectric gate insulating layer and a metal gate can be easily formed, and stable characteristics in the silicidation of the metal layer having very strong reactivity can be obtained.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A Schottky barrier tunnel transistor comprising:
a silicon on insulator (SOI) substrate;
a channel layer formed on the SOI substrate;
a source and a drain formed at both sides of the channel layer on the SOI substrate;
a gate formed on the channel layer;
a first gate insulating layer for insulating the gate from the source, the drain, and the channel layer;
a second gate insulating layer formed between the first gate insulating layer and the gate;
a reaction blocking layer covering portions of the SOI substrate on which the source, the drain, and the gate are not formed, and the source and drain;
a Hydrogen Silsesquioxane (HSQ) layer formed on the reaction blocking layer; and
a high-k dielectric insulating layer formed on the (HSQ) layer.

2. The Schottky barrier tunnel transistor according to claim 1, wherein the gate is entirely formed of metal.

3. The Schottky barrier tunnel transistor according to claim 1, wherein the second gate insulating layer is a high-k dielectric gate insulating layer.

* * * * *